United States Patent [19]

Cronin et al.

[11] Patent Number: 5,118,382
[45] Date of Patent: Jun. 2, 1992

[54] ELIMINATION OF ETCH STOP UNDERCUT

[75] Inventors: John E. Cronin, Milton, Vt.; Mark N. Lakritz, New Windsor, N.Y.

[73] Assignee: IBM Corporation, Armonk, N.Y.

[21] Appl. No.: 565,574

[22] Filed: Aug. 10, 1990

[51] Int. Cl.⁵ .............................................. H01L 21/00
[52] U.S. Cl. ................................... 156/643; 156/651; 156/653; 156/657; 437/228; 437/238; 437/241; 204/192.35
[58] Field of Search ............... 156/651, 657, 653, 643; 437/228, 235, 238, 241, 187; 204/192.35

[56] References Cited

U.S. PATENT DOCUMENTS

| | | | |
|---|---|---|---|
| 3,861,024 | 1/1975 | Napoli et al. | 437/187 X |
| 4,315,239 | 2/1982 | Daniele et al. | 156/653 X |
| 4,354,896 | 10/1982 | Hunter et al. | 156/652 X |
| 4,631,113 | 12/1986 | Donald | 156/656 X |
| 4,686,000 | 8/1987 | Heath | 156/653 X |

Primary Examiner—David A. Simmons
Assistant Examiner—Thi Dang
Attorney, Agent, or Firm—Whitham & Marhoefer

[57] ABSTRACT

Two methods for wet etch removing an etch stop layer without leaving an undesired undercut are disclosed. In the first method, a reactive ion etch is stopped on an etch stop layer. The exposed etch stop is wet etch removed, leaving an undesirable undercut. The undercut is filled by chemical vapor deposition of a fill material. The filler is then etched to leave a smooth aperture without undercuts. This last etch may be a sputter etch followed by a plasma etch. In the second method, a reactive ion etch is stopped on an etch stop layer as in the first method. Sacrificial sidewalls are then formed within the aperture. The exposed etch stop layer is then removed by wet etching, the positioning of the sidewalls serving to prevent undercutting of the etch stop layer. Finally, the sacrificial sidewalls are etched.

3 Claims, 2 Drawing Sheets

ELIMINATION OF ETCH STOP UNDERCUT

BACKGROUND OF THE INVENTION

1. Field of the Invention

The present invention generally relates to the manufacture of very large scale integrated (VLSI) circuits and, more particularly, to methods for wet etch removing an etch layer without leaving an undesired undercut in the process of manufacturing such circuits.

2. Description of the Prior Art

Borderless contact schemes employed in certain integrated circuit (IC) manufacturing processes have adopted an aluminum oxide ($Al_2O_3$) conformal film as an etch stop which is subsequently wet etched removed because of dry etch limitations. To properly remove the $Al_2O_3$ in known etchants, an undercut equal to the thickness of the $Al_2O_3$ results. This poses a problem for reliability and yield in the subsequent metal film deposition. The resulting undercut does not meet desired insulator dimensions for certain IC manufacturing processes. An example of minimum insulator dimensions is a worst case stud to stud spacing no less than 0.4 $\mu$m, but this is often not met with a 2500Å undercut in a 2500Å thickness of the $Al_2O_3$. The $Al_2O_3$ is the film of choice due to its etch stop characteristics. It is therefore required that some method be devised to eliminate this undercut.

U.S. Pat. No. 4,289,574 to Radigan et al. teaches etching aluminum and protecting layers below the aluminum. More specifically, Radigan et al. interpose $Al_2O_3$ between a thin aluminum film and a thick aluminum film so that in etching the thick aluminum, the $Al_2O_3$ serves as an etch stop. The $Al_2O_3$ can be redissolved later, and then the thin aluminum can be wet etched to maintain selectivity to the substrate. The use of multiple layers, as exemplified by Radigan et al., is complicated for the insulator stack case, and finding suitable materials with the right electrical properties is difficult.

U.S. Pat. No. 4,457,820 to Bergeron et al. teaches that in order to control an etch to a layer below, the layer is wet etched to a thickness that stops on the layer below in the thinner regions and then subjected to reactive ion etching (RIE) to maintain image size until all bottom layers are exposed. The undercut (or image size) in this case is controlled by the use of an RIE etch at the right part in the process. The undercut relative to the mask is not important since the mask is removed and the undercut is more easily dealt with.

U.S. Pat. No. 4,838,991 to Cote et al. teaches using an organic parylene spacer to make image sizes smaller; i.e., it is useful per se as an organic spacer and to control the contour of a given first material.

SUMMARY OF THE INVENTION

It is therefore an object of the present invention to provide a method to eliminate undercuts resulting from wet etching reactive ion etch stops.

According to the invention, there are provided two methods for wet etch removing an etch stop layer without leaving an undesired undercut. In the first method, a reactive ion etch (RIE) is stopped on an etch stop layer, such as $Al_2O_3$. The exposed etch stop is wet etch removed, leaving an undesirable undercut. The undercut is filled by chemical vapor deposition (CVD) of a fill material such as tellurium oxide sulfide (TeOS) or silicon nitride ($Si_3N_4$). The filler is then etched to leave a smooth aperture without undercuts. This last etch may be a two step process; e.g., a sputter etch followed by a plasma etch. In the second method, a RIE etch is stopped on an etch stop layer as in the first method. Sacrificial sidewalls are then formed within the aperture. The exposed etch stop layer is then removed by wet etching, the positioning of the sidewalls serving to prevent undercutting of the etch stop layer. Finally, the sacrificial sidewalls are etched.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
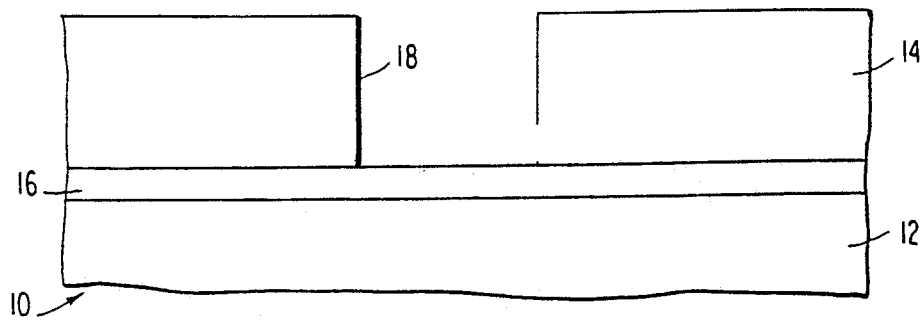
FIG. 1 is a cross-sectional view of a portion of a hypothetical semiconductor structure showing a portion of an oxide layer etched to an etch stop.
Figure 2:
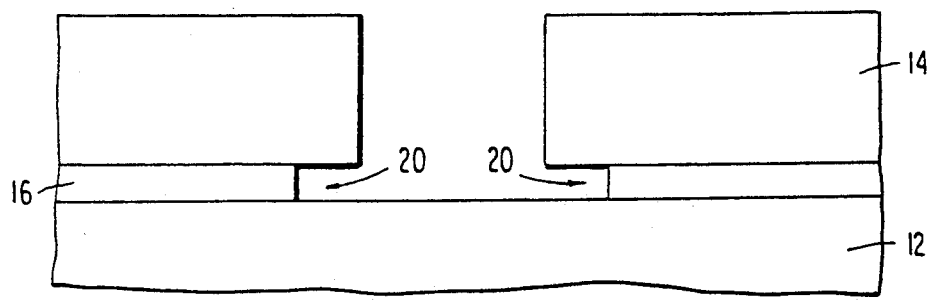
FIG. 2 is a cross-sectional view of like FIG. 1 showing the resulting undercut of the etch stop after wet etching.
Figure 3:
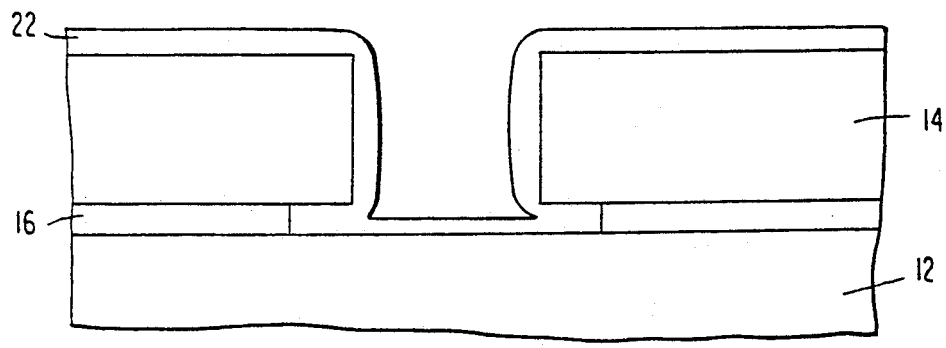
FIG. 3 is a cross-sectional view showing the deposit of a conforming fill layer according to the first method of the invention.
Figure 4:
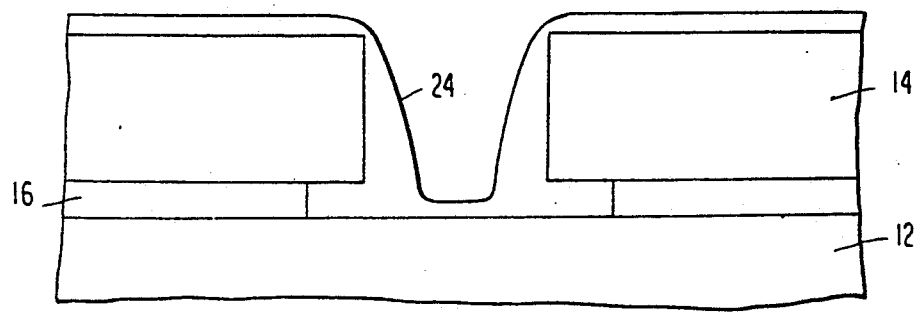
FIG. 4 is a cross-sectional view showing the result of a sputter etch of the fill layer to produce a "splash back"
Figure 5:
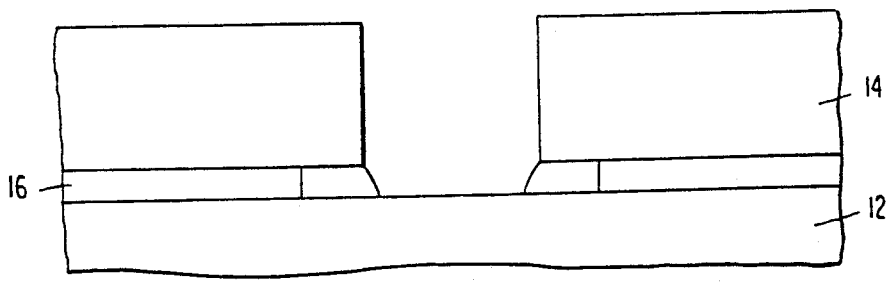
FIG. 5 is a cross-sectional view showing the result of a nondirectional plasma etch.

A first method according to the invention will now be described. In FIG. 1, there is shown a portion of an semiconductor structure 10, such as an integrated circuit. This structure includes a substrate 12, typically silicon, and an oxide layer 14, such as silicon dioxide ($SiO_2$), which has been anisotropically etched to a stop layer 16 of $Al_2O_3$ forming an opening having sidewalls 18. The stop layer of $Al_2O_3$ is then wet etched, resulting in the undesirable undercut 20 as shown in FIG. 2. After the $Al_2O_3$ is wet etched producing a 2500Å±500Å undercut for a 2500Å thick etch stop, a 1250 to 1300Å layer 22 of tellurium oxide sulfide (TeOS) or silicon nitride ($Si_3N_4$) is deposited using a chemical vapor deposition (CVD) process. These CVD layers, deposited with or without plasma assistance, cover the substrate with extreme uniformity and conform to the substrate, thus enclosing the sidewall 18 of the opening and filling the undercut 20 as shown in FIG. 3. After this conformal deposition, a light sputter etch is performed to produce the "splash back" profile 24 typically shown in FIG. 4. Finally, a non-directional reactive ion plasma etch is used to recess the hole back to the final shape as shown in FIG. 5, leaving the TeOS or $Si_3N_4$ fill material in the undercut.

Figure 6:
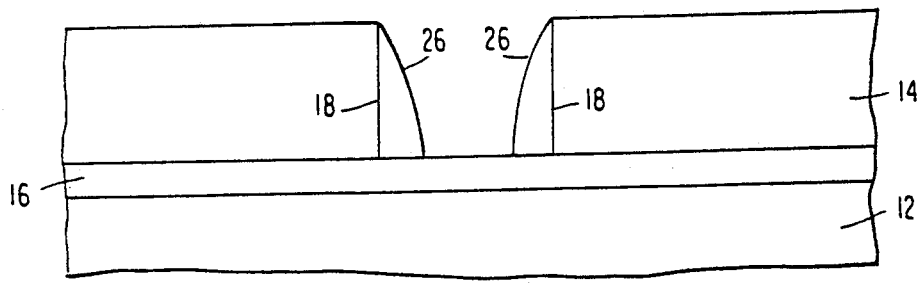
FIG. 6 is a cross-sectional view showing the deposing of a sacrificial sidewall according to the second method of the invention.
Figure 7:
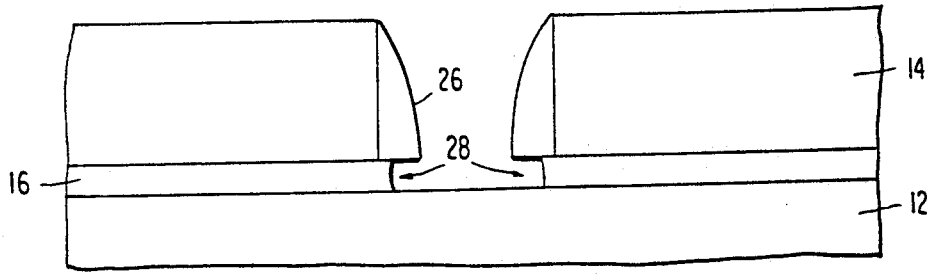
FIG. 7 is a cross-sectional view showing the result of a wet etch of etch stop.
Figure 8:
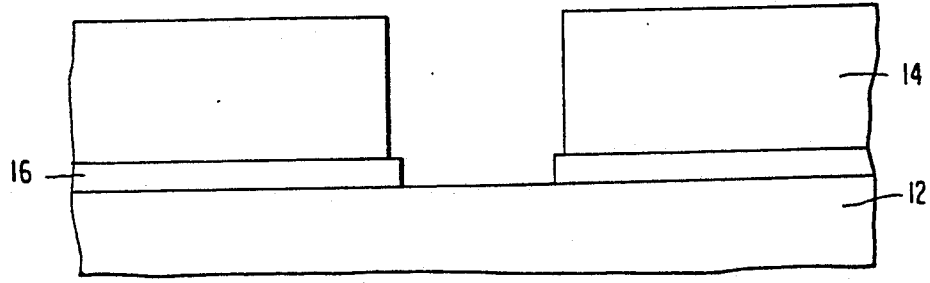
FIG. 8 is a cross-sectional view showing the removal of the sacrificial sidewall.

Referring next of FIG. 6, there is shown an oxide layer which has been etched to a stop layer of $Al_2O_3$ as in FIG. 1. However, instead of wet etching the $Al_2O_3$ as shown in FIG. 2, producing the undesirable undercut, the second method according to the invention employs a sacrificial spacer. More specifically, after the oxide is etched, stopping on the $Al_2O_3$, a sacrificial spacer material 26 is deposited on the sidewall 18 of the opening as shown in FIG. 6. Examples of suitable materials for the spacer are organic compounds such as poly-p-xuylylene, known as "parylene", and certain inorganic compounds such as silicon nitride ($Si_3N_4$). The CVD deposited sacrificial material is etched using a reactive ion etch (RIE) process to form spacers in the contact holes as shown in FIG. 6. The spacer thickness is chosen to be greater than or equal to the worst case wet etch undercut of the $Al_2O_3$, in this case 2500Å±500Å. The $Al_2O_3$ is then wet etched, leaving the sacrificial spacer 26 intact, as shown in FIG. 7. The resulting undercut 28 thus does not extend under the oxide layer 14. The spacer 26 is subsequently removed in an $O_2$ heat treatment (200° C.), if it is parylene, or removed in an appropriate $Si_3N_4$ removing non-directional plasma, as shown in FIG. 8.

Although these two methods could be considered very general solutions to removal of etch stops in contact holes, they are particularly advantageous due to the fact that the spacers can be formed on vertical surfaces, not on any others. If spacers are formed on any thin vertical regions inside an emitter structure, an extended spacer over etch would remove these and still leave an ample amount on thick vertical insulator regions as may be required.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method for the elimination of contact hole etch stop undercut in the manufacture of a semiconductor structure comprising the steps of:
    anisotropically etching an insulator layer to an etch stop layer formed on a substrate;
    wet etching said stop layer forming an undercut between said insulator layer and said substrate;
    chemical vapor depositing a conforming insulating film over said semiconductor structure and filling said undercut;
    sputter etching said insulating film to form a splash back within an etched hole in said insulator layer; and
    non-directional plasma etching said insulating film after said sputter etching.

2. The method recited in claim 1 wherein said etch stop layer is $Al_2O_3$.

3. The method recited in claim 1 wherein said insulating film is selected from the group consisting of TeOS and $Si_3N_4$.

* * * * *